(12) United States Patent
Sun

(10) Patent No.: US 10,910,497 B2
(45) Date of Patent: Feb. 2, 2021

(54) THIN FILM TRANSISTOR HAVING LIGHT SHIELDING LAYER

(71) Applicant: BOE TECHNOLOGY GROUP CO., LTD., Beijing (CN)

(72) Inventor: Xuefei Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 53 days.

(21) Appl. No.: 16/330,292

(22) PCT Filed: May 15, 2018

(86) PCT No.: PCT/CN2018/086811
§ 371 (c)(1),
(2) Date: Mar. 4, 2019

(87) PCT Pub. No.: WO2018/233405
PCT Pub. Date: Dec. 27, 2018

(65) Prior Publication Data
US 2019/0207038 A1    Jul. 4, 2019

(30) Foreign Application Priority Data

Jun. 19, 2017  (CN) .......................... 2017 1 0467529

(51) Int. Cl.
*H01L 29/10*       (2006.01)
*H01L 21/00*       (2006.01)
(Continued)

(52) U.S. Cl.
CPC .... *H01L 29/78633* (2013.01); *H01L 27/3274* (2013.01); *H01L 29/4908* (2013.01);
(Continued)

(58) Field of Classification Search
CPC ............. H01L 27/0635; H01L 29/0696; H01L 29/0804; H01L 29/08221; H01L 29/1079;
(Continued)

(56) References Cited

U.S. PATENT DOCUMENTS 10,424,669 B2 *  9/2019  Guo ...................... G02F 1/1368
2010/0171131 A1  7/2010  Iki
(Continued)

FOREIGN PATENT DOCUMENTS

CN        1334483 A     2/2002
CN        1521858 A     8/2004
(Continued)

OTHER PUBLICATIONS

PCT International Search Report, Application No. PCT/CN2018/086811, dated Aug. 20, 2018, 6 pages: with English translation.
(Continued)

*Primary Examiner* — Alonzo Chambliss
(74) *Attorney, Agent, or Firm* — Armstrong Teasdale LLP

(57) ABSTRACT

The embodiment of the invention discloses a thin film transistor, a method for manufacturing the same, an array substrate thereof and a display panel thereof, wherein the thin film transistor includes: a light shielding layer, wherein the light shielding layer includes a first layer for preventing light from a backlight source from entering a channel region of an active layer and a second layer for preventing light from an interlayer light source from entering the channel region of the active layer. The present invention is provided with the light shielding layer, which not only prevents the backlight from entering the channel region of the active layer, but also prevents the interlayer light from entering the channel region of the active layer, thereby reducing the adverse effect of the light source on the active layer and thus improving the quality of the thin film transistor.

14 Claims, 5 Drawing Sheets

(51) Int. Cl.
*H01L 29/786* (2006.01)
*H01L 29/66* (2006.01)
*H01L 27/32* (2006.01)
*H01L 29/49* (2006.01)

(52) U.S. Cl.
CPC .... *H01L 29/6675* (2013.01); *H01L 29/66757* (2013.01); *H01L 29/78675* (2013.01)

(58) Field of Classification Search
CPC . H01L 29/36; H01L 29/4236; H01L 27/3272; H01L 27/3262; H01L 29/42376; H01L 29/397; H01L 29/78633; H01L 29/6675; H01L 29/66757; H01L 29/4908; H01L 27/3274; G01K 7/01
See application file for complete search history.

(56) References Cited

U.S. PATENT DOCUMENTS

2014/0175445 A1* 6/2014 Cai .................. H01L 29/78633 257/70
2014/0183476 A1* 7/2014 Kwon ............... H01L 29/41733 257/40
2015/0378182 A1* 12/2015 Shin .................... H01L 29/7869 257/40
2016/0254283 A1* 9/2016 Shen .................. H01L 27/1248 257/72

FOREIGN PATENT DOCUMENTS

| CN | 101022085 A | 8/2007 |
| CN | 103904086 A | 7/2014 |
| CN | 104871321 A | 8/2015 |
| CN | 105103299 A | 11/2015 |
| CN | 107302032 A | 10/2017 |

OTHER PUBLICATIONS

PCT Written Opinion, Application No. PCT/CN2018/086811, dated Aug. 20, 2018, 5 pages.: with English translation of relevant part.
China First Office Action, Application No. 201710467529.8, dated Apr. 16, 2019, 13 pps. with English translation.

* cited by examiner

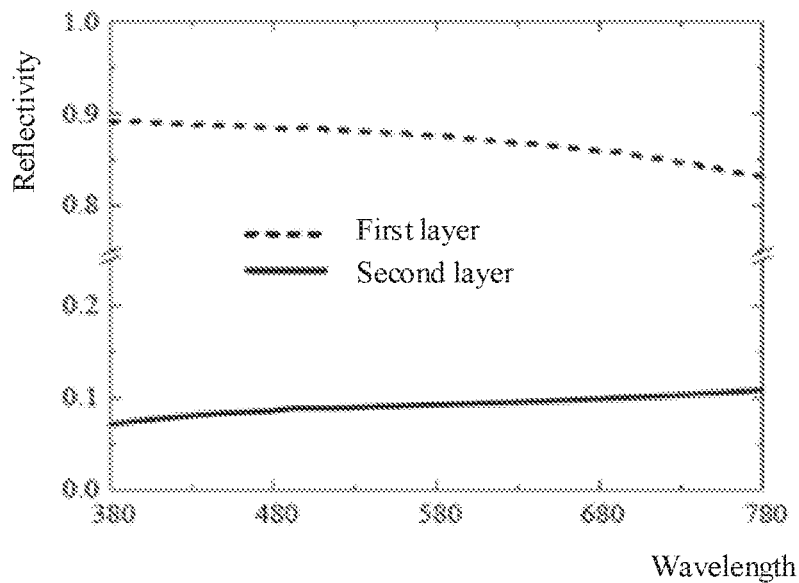

Fig. 3 forming a light shielding layer on a substrate, wherein the light shielding layer includes a first layer for preventing light from a backlight source from entering a channel region of an active layer and a second layer for preventing light from an interlayer light source from entering the channel region of the active layer  ~ 100 forming an active layer on the substrate on which the light shielding layer is formed  ~ 200

Fig. 4

THIN FILM TRANSISTOR HAVING LIGHT SHIELDING LAYER

CROSS REFERENCE TO RELATED APPLICATIONS

This patent application is a National Stage Entry of PCT/CN2018/086811 filed on May 15, 2018, which claims the benefit and priority of Chinese Patent Application No. 201710467529.8 filed on Jun. 19, 2017, the disclosures of which are incorporated by reference herein in their entirety as part of the present application.

BACKGROUND

The present disclosure relates to the field of display technologies, and more particularly, to a thin film transistor, a method for manufacturing the same, an array substrate thereof, and a display panel thereof.

With the continuous development of thin film transistor (TFT) liquid crystal display technology, TFT display devices using low-temperature polysilicon (LTPS) technology, which have features of low power consumption, high resolution, fast response speed and high aperture ratio, have gradually become the mainstream. The TFT display devices are widely used in various electronic devices such as liquid crystal televisions, smart phones, tablets, and digital electronic devices.

At present, a thin film transistor includes elements such as an active layer, a gate electrode, and a source-drain electrode, etc. However, the irradiation to the active layer by a backlight source causes an increased amount of photo-generated carriers, thereby causing a threshold voltage shift, especially a blue light band in the backlight source. Therefore, in the prior art, in order to prevent the active layer of the TFT from being irradiated by the backlight source, a light shielding layer is provided on a substrate at a position corresponding to a channel region of the active layer.

In the conventional process, a metal such as molybdenum is generally used as the light shielding layer. Although the backlight source can be blocked by the light shielding layer, light from an interlayer light source will be reflected by the light shielding layer composed of the metal to the channel region of the active layer, thereby adversely affecting the active layer, resulting in decreased quality of thin film transistors.

BRIEF DESCRIPTION

In order to solve the above technical problem, the present disclosure provides a thin film transistor, a method for manufacturing the same, an array substrate thereof, and a display panel thereof.

In order to attain the purpose of the present disclosure, the present disclosure provides a thin film transistor, including a light shielding layer, wherein the light shielding layer includes a first layer for preventing light from a backlight source from entering a channel region of an active layer and a second layer for preventing light from an interlayer light source from entering the channel region of the active layer.

Further, the active layer is disposed on one side of the second layer, the first layer is disposed on other side of the second layer, the first layer and the second layer form a light shielding pattern, and an orthographic projection of the light shielding pattern on a substrate is greater than or equal to an orthographic projection of the channel region of the active layer on the substrate.

Further, a material of the first layer is metal and a material of the second layer is a silicon oxide.

Further, materials of the first layer and the second layer are both a composite including a metal and a silicon oxide.

Further, a content of the metal in the light shielding layer is gradually decreased and a content of the silicon oxide in the light shielding layer is gradually increased along a direction from a side of the light shielding layer away from the active layer to a side of the light shielding layer adjacent to the active layer.

Further, a reflectivity of a side of the first layer away from the active layer is 0.84 to 0.9, and a reflectivity of a side of the second layer adjacent to the active layer is 0.07 to 0.11.

In addition, an embodiment of the present disclosure further provides an array substrate including a thin film transistor.

In addition, an embodiment of the present disclosure further provides a display panel including an array substrate.

In addition, an embodiment of the present disclosure further provides a method for manufacturing a thin film transistor, including forming a light shielding layer on a substrate, wherein the light shielding layer includes a first layer for preventing light from a backlight source from entering a channel region of an active layer and a second layer for preventing light from an interlayer source from entering the channel region of the active layer, forming the active layer on the substrate on which the light shielding layer is formed.

Further, the forming a light shielding layer on a substrate specifically includes forming a first thin film and a second thin film on the substrate by an electron beam evaporation process or a high vacuum chemical vapor deposition process, and forming the light shielding layer including the first layer and the second layer by a patterning process.

The present disclosure provides the thin film transistor, the method for manufacturing the same, the array substrate thereof, and the display panel thereof. The thin film transistor includes a light shielding layer, wherein the light shielding layer includes a first layer for preventing light from a backlight source from entering a channel region of an active layer, and a second layer for preventing light from an interlayer light source from entering the channel region of the active layer.

BRIEF DESCRIPTION OF THE DRAWINGS

The drawings are used to provide a further understanding of the technical solutions of the present disclosure, and constitute a part of the specification, which together with the embodiments of the present application are used to explain the technical solutions of the present disclosure, and do not constitute a limit to the technical solutions of the present disclosure.

FIG. 3 is a graph showing the reflectivity of the first layer and the second layer changes as the wavelength of the incident light;

FIG. 4 is a flowchart of a method for manufacturing a thin film transistor according to an embodiment of the present disclosure;

DETAILED DESCRIPTION

In order to make the technical solutions and the advantages more explicitly and more clear, the embodiments of the present disclosure will be described in detail below with reference to the accompanying drawings. It should be noted that, in the case of no conflict, the features in the embodiments and the embodiments in the present application may be arbitrarily combined with each other.

The steps illustrated in the flowchart of the accompanying drawings may be executed in a computer system such as a set of computer executable instructions. Also, although logical sequences are shown in the flowcharts, in some cases the steps shown or described may be performed in a different order than the ones described herein.

For the sake of clarity, the thickness and dimension of the layers or microstructures are exaggerated in the accompanying drawings used to describe embodiments of the disclosure. It will be understood that when an element such as a layer, a film, a region or a substrate is referred to as being "on" or "below" another element, this element may be "directly" "on" or "below" the another element, or there may be intermediate elements between this element and another element.

Embodiment One

Figure 1:
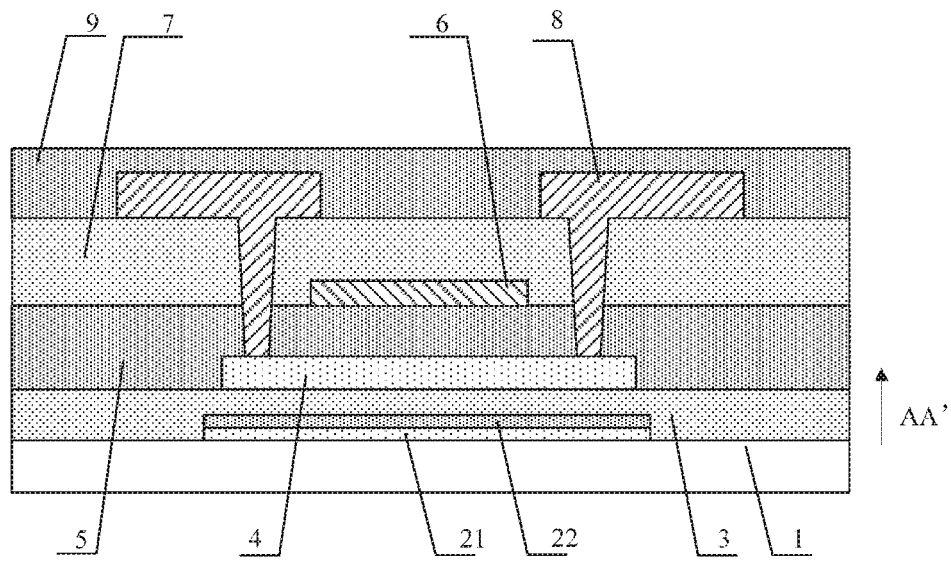
FIG. 1 is a schematic structural diagram of a thin film transistor according to an embodiment of the present disclosure.

FIG. 1 is a schematic structural diagram of a thin film transistor according to an embodiment of the present disclosure. As shown in FIG. 1, a thin film transistor provided by an embodiment of the disclosure includes a light shielding layer. The light shielding layer includes a first layer 21 for preventing light from a backlight source from entering a channel region of an active layer and a second layer 22 for preventing light from an interlayer light source from entering the channel region of the active layer.

Wherein, the structure of the thin film transistor in the embodiment of the present disclosure is a top gate structure. The thin film transistor shown in FIG. 1 further includes a substrate 1, a buffer layer 3, the active layer 4, a gate insulating layer 5, a gate electrode 6, and an interlayer insulating layer 7, a source/drain electrode 8, and a passivation layer 9.

In the embodiment of the present disclosure, the active layer 4 is disposed on one side of the second layer 22, and the first layer 21 is disposed on other side of the second layer 22. The first layer 21 and the second layer 22 form a light shielding pattern. It should be noted that, for the purpose that the light shielding layer can block light from the backlight source from being irradiated to the channel region of the active layer as much as possible, an orthographic projection of the light shielding pattern on the substrate is greater than or equal to an orthographic projection of the channel region of the active layer on the substrate.

In this embodiment, the thickness of the light shielding layer is 50 to 150 nm. In some embodiments of the present disclosure, the thickness of the light shielding layer is 100 nm, it should understood that, as long as a total thickness of the first layer 21 and the second layer 22 is equal to the thickness of the light shielding layer. The thickness of the first layer 21 and the thickness the second layer 22 are not limited by the present disclosure, and can be specifically determined according to actual needs.

Specifically, as an implementation, a material of the first layer 21 may be a metal, and a material of the second layer 22 may be a silicon oxide, wherein the metal may include molybdenum, gold, copper, aluminum, or alloy, which is not limited in the disclosure. It should be noted that, due to a reflectivity of the metal of the first layer is higher, the light that is irradiated from the backlight source to the channel region of the active layer is reflected back, and cannot enter the channel region of the active layer. Further, due to a reflectivity of the silicon oxide of the second layer is lower, the light that is irradiated from the interlayer light source to the silicon oxide is not reflected to the channel region of the active layer.

As another implementation, materials of the first layer 21 and the second layer 22 are both a composite including a metal and a silicon oxide, wherein the metal may include molybdenum, gold, copper, aluminum or an alloy, and which is not limited in the present disclosure.

Figure 2:
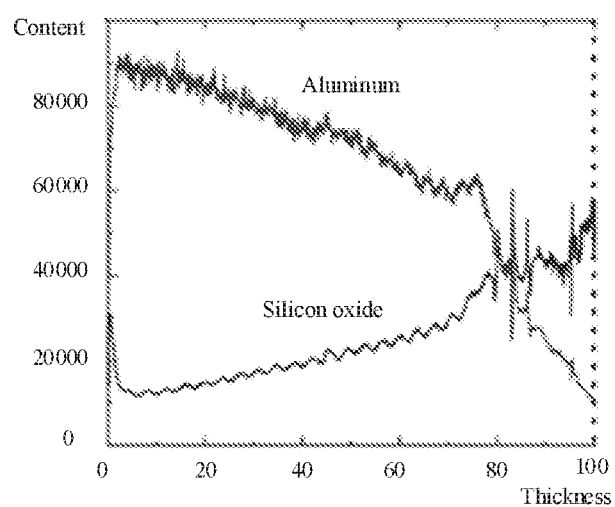
FIG. 2 is a graph showing a content change of a component of a light shielding layer according to an embodiment of the present disclosure.

It should be noted that, a content of the metal in the light shielding layer gradually decreases and a content of the silicon oxide in the light shielding layer gradually decreases along a direction from a side of the light shielding layer away from the active layer to a side of the light shielding layer adjacent to the active layer. Specifically, the content of aluminum in the first layer is higher than the content of aluminum in the second layer, and the content of the silicon oxide in the second layer is higher than the content of the silicon oxide in the first layer. FIG. 2 is a graph showing a content change of a component of a light shielding layer according to an embodiment of the present disclosure. Specifically, FIG. 2 is an example in which the thickness of the light shielding layer is 100 nm and the metal is aluminum.

FIG. 3 is a graph showing the reflectivity of the first layer and the second layer changes as the wavelength of the incident light. As shown in FIG. 3, the reflectivity of the first layer decreases as the wavelength of the incident light increases, and the reflectivity of the second layer increases as the wavelength of the incident light increases, wherein the reflectivity of a side of the first layer 21 away from the active layer is 0.84 to 0.9, and the reflectivity of a side of the second layer 22 adjacent to the active layer is 0.07 to 0.11. It should be noted that, it should be noted that, the content of the metal in the first layer is higher, and since the reflectivity of the metal is higher, the light that is irradiated from the backlight source to the channel region of the active layer is reflected back, and cannot enter the channel region of the active layer. The content of the silicon oxide in the second layer is higher, and since the reflectivity of the silicon oxide is lower, the light that is irradiated from the interlayer light source to the silicon oxide is not reflected to the channel region of the active layer.

Embodiments of the present disclosure provide a thin film transistor. The thin film transistor includes a light shielding layer, wherein the light shielding layer includes a first layer for preventing light from a backlight source from entering a channel region of an active layer and a second layer for preventing light from an interlayer light source from entering the channel region of the active layer. The light shielding layer provided by the disclosure not only prevents light from the backlight source from entering the channel region of the active layer, but also prevents light from the interlayer light source from entering the channel region of the active layer, thereby reducing adverse effects of the light source on the active layer and thus improving the quality of the thin film transistor.

Embodiment Two

Based on the inventive concept of the foregoing embodiments, FIG. 4 is a flowchart of a method for manufacturing a thin film transistor according to an embodiment of the present disclosure. As shown in FIG. 4, a method for manufacturing a thin film transistor according to an embodiment of the present disclosure, specifically including the following steps:

Step 100: forming a light shielding layer on a substrate, wherein the light shielding layer includes a first layer for preventing light from a backlight source from entering a channel region of an active layer and a second layer for preventing light from an interlayer light source from entering the channel region of the active layer.

Wherein, the substrate is a glass substrate. The substrate can be pre-cleaned during the formation of the light shielding layer.

In the embodiment of the present disclosure, the first layer and the second layer form a light shielding pattern. It should be noted that, for the purpose that the light shielding layer can block light from the backlight source from being irradiated to the channel region of the active layer as much as possible, an orthographic projection of the light shielding pattern on the substrate is greater than or equal to an orthographic projection of the channel region of the active layer on the substrate.

In this embodiment, the thickness of the light shielding layer is 50 to 150 nm. In some embodiments of the present disclosure, the thickness of the light shielding layer is 100 nm, it should be understood that, as long as a total thickness of the first layer and the second layer is equal to the thickness of the light shielding layer. The thickness of the first layer and the thickness the second layer are not limited by the present disclosure, and can be specifically determined according to actual needs.

Specifically, as an implementation, a material of the first layer may be a metal, and a material of the second layer may be a silicon oxide, wherein the metal may include molybdenum, gold, copper, aluminum, or alloy, which is not limited in the disclosure. It should be noted that, due to a reflectivity of the metal is higher, the light that is irradiated from the backlight source to the channel region of the active layer is reflected back, and cannot enter the channel region of the active layer. Due to a reflectivity of the silicon oxide is lower, the light that is irradiated from the interlayer light source to the silicon oxide is not reflected to the channel region of the active layer. It is to be understood that, in the implementation, the step 100 specifically includes forming a first thin film and a second thin film by using an electron beam evaporation process or a high vacuum chemical vapor deposition process on the substrate, and forming a light shielding layer of the first layer and the second layer by a patterning process.

As another implementation, the materials of the first layer and the second layer are both a composite including a metal and a silicon oxide, wherein the metal may include molybdenum, gold, copper, aluminum, or an alloy, which is not limited in the disclosure. It should be noted that, in the direction of the thickness increases, the content of the metal of the light shielding layer is gradually decreased, and the content of the silicon oxide is gradually increased. Step 100 specifically includes forming a first thin film and a second thin film by using an electron beam evaporation process or a high vacuum chemical vapor deposition process on the substrate, and forming a light shielding layer of the first layer and the second layer by a patterning process.

Step 200: forming an active layer on the substrate on which the light shielding layer is formed.

Specifically, the active layer is disposed on one side of the second layer, and the first layer is disposed on other side of the second layer.

A method for manufacturing a thin film transistor according to an embodiment of the present disclosure specifically includes forming a light shielding layer on a substrate, wherein the light shielding layer includes a first layer for preventing light from a backlight source from entering a channel region of an active layer and a second layer for preventing light from an interlayer light source from entering the channel region of the active layer, and forming the active layer on the substrate on which the light shielding layer is formed. By forming the light shielding layer including the first layer for preventing light from the backlight source from entering the channel region of the active layer and the second layer for preventing light from the interlayer light source from entering the channel region of the active layer, the disclosure can not only prevent light from the backlight source from entering the channel region of the active layer, but also prevent light from the interlayer light source from entering the channel region of the active layer, thereby reducing the adverse effects of the light source on the active layer and thus improving the quality of the thin film transistor.

The method for manufacturing the thin film transistor according to embodiment two of the present disclosure will be further specifically described below with reference to FIGS. 5A to 5H.

Figure 5A:
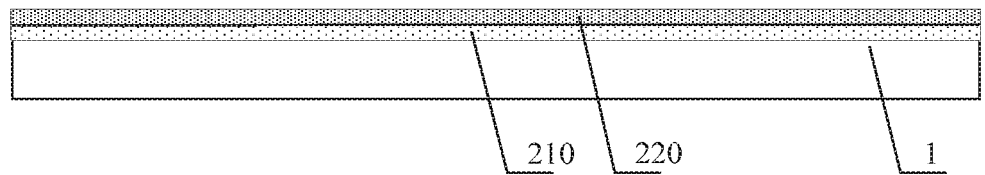
FIG. 5A is schematic diagram one of a method for manufacturing a thin film transistor according to embodiment two of the present disclosure.

Step 301: sequentially forming a first thin film 210 and a second thin film 220 on the substrate 1, as shown in FIG. 5A.

Wherein, the substrate 1 is a glass substrate. Specifically, the first thin film and the second thin film are specifically formed by an electron beam evaporation process or a high vacuum chemical vapor deposition process.

Wherein, a material of the first thin film is a metal, a material of the second thin film is a silicon oxide, or materials of the first thin film and the second thin film are both a composite including the metal and the silicon oxide. Specifically, the metal includes molybdenum, gold, copper, aluminum, or alloy. It should be understood that, the metal material forming the light shielding layer can also be selected according to specific needs, which is not limited in the disclosure.

Figure 5B:
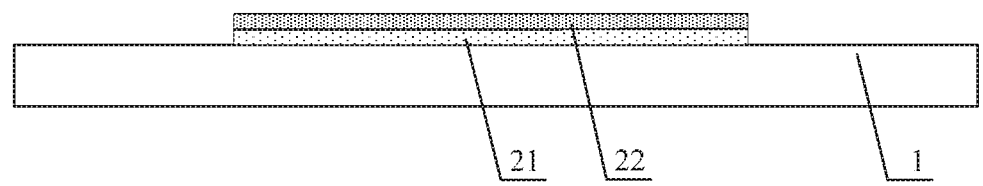
FIG. 5B is schematic diagram two of a method for manufacturing a thin film transistor according to embodiment two of the present disclosure.

Step 302: forming a light shielding layer including a first layer 21 and a second layer 22 by a patterning process, as shown in FIG. 5B.

Wherein, the patterning process includes photoresist coating, exposure, development, etching, photoresist stripping, and the like.

Figure 5C:
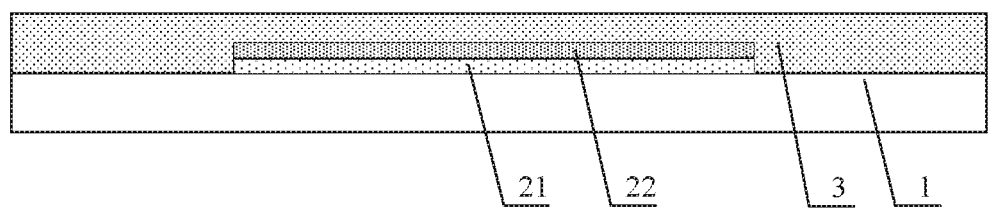
FIG. 5C is schematic diagram three of a method for manufacturing a thin film transistor according to embodiment two of the present disclosure.

Step 303: depositing a buffer layer 3 on the light shielding layer, in which the buffer layer 3 covers the entire substrate 1, as shown in FIG. 5C.

Specifically, the buffer layer is deposited by the methods such as CVD, vapor deposition, or sputtering, etc., which is not limited in the embodiment of the present disclosure. The buffer layer 3 may be a $SiN_x$ or $SiO_x$ thin film having an uniform and dense single-layer structure. The $SiN_x$ has a thickness of 50 to 150 nm, and the $SiO_x$ has a thickness of 100 to 350 nm. Or, the buffer layer may be a $SiN_x/SiO_x$ thin film having an uniform and dense double-layer structure, wherein the $SiN_x$ has a thickness of 50 to 150 nm and the $SiO_x$ has a thickness of 100 to 350 nm, and wherein for the $SiN_x/SiO_x$ thin film has a double-layer structure, the upper layer is $SiO_x$, and the lower layer is $SiN_x$.

Figure 5D:
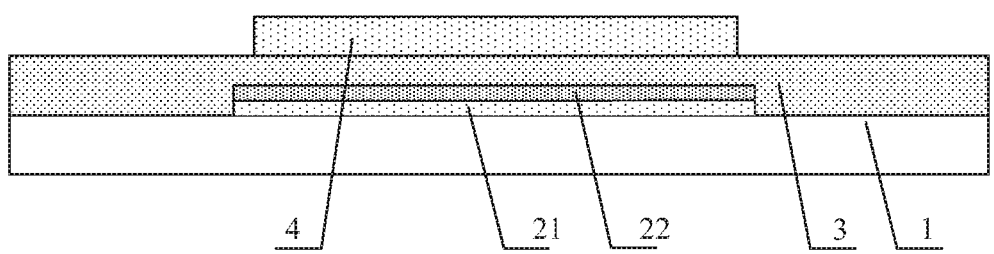
FIG. 5D is schematic diagram four of a method for manufacturing a thin film transistor according to embodiment two of the present disclosure.

Step 304: depositing an amorphous silicon layer on the buffer layer 3, performing an excimer laser annealing treatment on the amorphous silicon layer, such that the amorphous silicon layer is crystallized into a polysilicon layer, and applying a patterning process, which includes processes such as photoresist coating, exposure, development, etching, photoresist stripping, etc., to the polysilicon layer to form the active layer 4, as shown in FIG. 5D.

Wherein, an orthographic projection of the channel region of the active layer 4 on the substrate is less than or equal to an orthographic projection of the light shielding layer on the substrate.

Figure 5E:
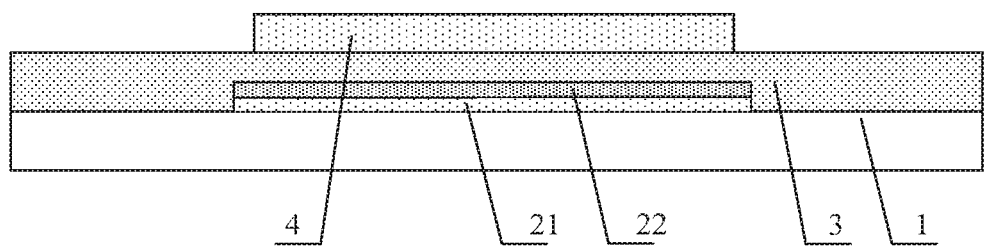
FIG. 5E is schematic diagram five of a method for manufacturing a thin film transistor according to embodiment two of the present disclosure.

Step 305: forming a gate insulating layer 5 on the active layer 4, in which the gate insulating layer 5 covers the entire substrate, as shown in FIG. 5E.

Specifically, the gate insulating layer 5 is in contact with the active layer 4 and the substrate 1. In the embodiment of the disclosure, the gate insulating layer 5 is deposited on the active layer by the methods such as CVD, evaporation, or sputtering, etc. Further, the gate insulating layer may be a silicon oxide layer, a silicon nitride layer, or a composite insulating layer composed of the silicon oxide or the silicon nitride, etc., which is not limited in this embodiment of the present disclosure.

Figure 5F:
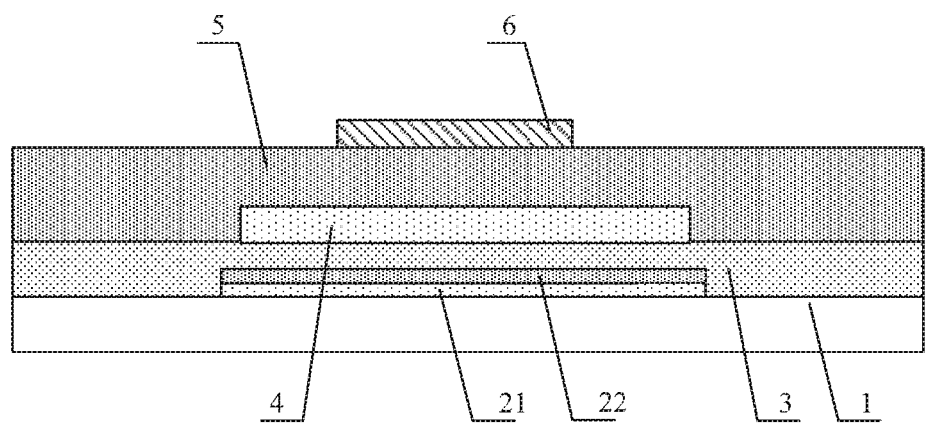
FIG. 5F is schematic diagram six of a method for manufacturing a thin film transistor according to embodiment two of the present disclosure.

Step 306: forming a gate electrode 6 on the gate insulating layer 5, as shown in FIG. 5F.

Specifically, for forming a gate electrode on the gate insulating layer, a metal layer is formed on the gate insulating layer 5 by a deposition method such as CVD, evaporation, or sputtering, etc., and then the gate electrode is formed on the gate insulating layer at a time by a patterning process including processes such as photoresist coating, exposure, development, etching, photoresist stripping, etc.

Further, the metal layer may be a metal layer, a tungsten layer, a chrome layer or a conductive layer of a metal or a metal compound, and the like, which is not limited in the embodiment of the present disclosure.

Figure 5G:
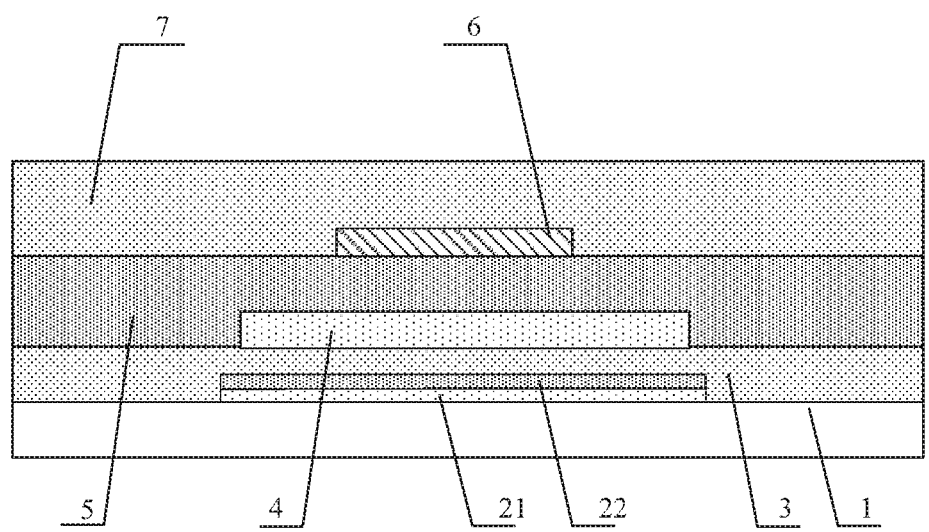
FIG. 5G is schematic diagram seven of a method for manufacturing a thin film transistor according to embodiment two of the present disclosure.

Step 307: forming an interlayer insulating layer 7 on the gate electrode 6, in which the interlayer insulating layer 7 covers the entire substrate, as shown in FIG. 5G.

Specifically, the interlayer insulating layer 7 may be deposited on the gate electrode 6 by a method such as CVD, evaporation, or sputtering, which is not limited in the embodiment of the present disclosure, wherein the interlayer insulating layer 7 can protect the gate electrode 6 and isolate the gate electrode 6 and the subsequently formed source and drain electrodes, and wherein the interlayer insulating layer 7 is made of a material such as silicon oxide or silicon nitride, etc., which is not limited in the embodiment of the disclosure.

Figure 5H:
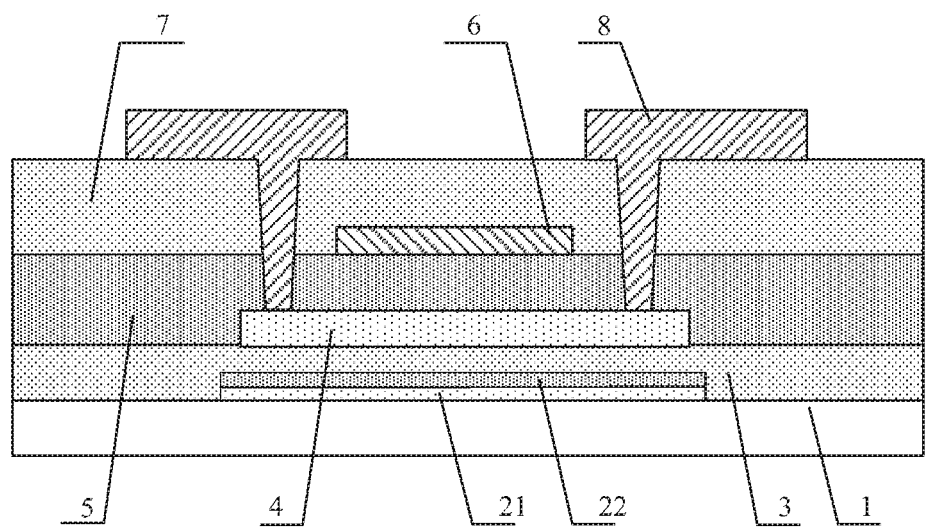
FIG. 5H is schematic diagram eight of a method for manufacturing a thin film transistor according to embodiment two of the present disclosure.

Step 308: forming a source via and a drain via penetrating into the active layer within the interlayer insulating layer 7 and the gate insulating layer 5 by a patterning process including processes such as photoresist coating, exposure, development, etching, photoresist stripping, and the like, and forming a source/drain electrode 8, in which the source/drain electrode 8 is connected to the active layer through the source via and the drain via, specifically as shown in FIG. 5H.

Specifically, in step 308, a conductive material may be deposited on a surface of the interlayer insulating layer 7 having the source via and the drain via, and the source/drain electrode is formed by a patterning process including processes such as photoresist coating, exposure, development, etching, and photoresist stripping, etc.

Wherein, the conductive material may be metal, tungsten, chromium, or other metals and metal compounds, and the like, which is not limited in the embodiment of the present disclosure.

Step 309: forming a passivation layer 9 on the source/drain electrode 8, specifically as shown in FIG. 1.

Specifically, the passivation layer 9 can protect the source/drain electrode 8 and isolate the source/drain electrode 8 and subsequently formed pixel electrodes, wherein the passivation layer 9 can be made of the silicon oxide and the silicon nitride, etc., which is not limited in the embodiment of the disclosure.

Embodiment Three

Based on the inventive concept of the foregoing embodiments, the embodiment three of the present disclosure provides an array substrate including a thin film transistor.

Wherein, the thin film transistor is the thin film transistor described in the embodiment one, and the implementation principle thereof is similar to the implementation effect, and details are not described herein again.

Embodiment Four

Based on the inventive concept of the foregoing embodiments, the embodiment four of the present disclosure provides a display panel including an array substrate.

Wherein, the array substrate is the array substrate described in the embodiment three, and the implementation principle thereof is similar to the implementation effect, and details are not described herein again.

The embodiments disclosed in the present disclosure are as described above, but the content described above are merely used to facilitate the understanding of the present disclosure, and are not intended to limit the present disclosure. Any modification and variation in the form and details of the implementation may be made by those skilled in the art without departing from the spirit and scope of the disclosure. The scope of the present disclosure is to be determined by the scope of the appended claims.

What is claimed is:

1. A thin film transistor comprising a light shielding layer, wherein the light shielding layer comprises a first layer for preventing light from a backlight source from entering a channel region of an active layer and a second layer for preventing light from an interlayer light source from entering the channel region of the active layer, wherein materials of the first layer and the second layer are both a composite comprising a metal and a silicon oxide.

2. The thin film transistor according to claim 1, wherein the active layer is disposed on one side of the second layer, wherein the first layer is disposed on other side of the second layer, wherein the first layer and the second layer form a light shielding pattern, and wherein an orthographic projection of the light shielding pattern on a substrate is greater than or equal to an orthographic projection of the channel region of the active layer on the substrate.

3. An array substrate comprising the thin film transistor according to claim 2.

4. The thin film transistor according to claim 1, wherein a content of the metal in the light shielding layer is gradually decreased and a content of the silicon oxide in the light shielding layer is gradually increased along a direction from a side of the light shielding layer away from the active layer to a side of the light shielding layer adjacent to the active layer.

5. The thin film transistor according to claim 4, wherein a reflectivity of a side of the first layer away from the active layer is in a range from 0.84 to 0.9, and wherein a reflectivity of a side of the second layer adjacent to the active layer is in a range from 0.07 to 0.11.

6. An array substrate comprising the thin film transistor according to claim 4.

7. The thin film transistor according to claim 1 wherein a reflectivity of a side of the first layer away from the active layer is in a range from 0.84 to 0.9, and wherein a reflectivity of a side of the second layer adjacent to the active layer is in a range from 0.07 to 0.11.

8. An array substrate comprising the thin film transistor according to claim 7.

9. An array substrate comprising the thin film transistor according to claim 1.

10. A display panel comprising the array substrate according to claim 9.

11. A thin film transistor comprising a light shielding layer, wherein the light shielding layer comprises a first layer for preventing light from a backlight source from entering a channel region of an active layer and a second layer for preventing light from an interlayer light source from entering the channel region of the active layer, and wherein a material of the first layer is metal and a material of the second layer is a silicon oxide.

12. An array substrate comprising the thin film transistor according to claim 11.

13. A method for manufacturing a thin film transistor, the method comprising:

forming a light shielding layer on a substrate, wherein the light shielding layer comprises a first layer for preventing light from a backlight source from entering a channel region of an active layer and a second layer for preventing light from an interlayer light source from entering the channel region of the active layer; and forming the active layer on the substrate on which the light shielding layer is formed, wherein a material of the first layer is metal and a material of the second layer is a silicon oxide, or wherein materials of the first layer and the second layer are both a composite comprising a metal and a silicon oxide.

14. The method according to claim 13, wherein forming a light shielding layer on a substrate specifically comprises:

forming a first thin film and a second thin film on the substrate by one of an electron beam evaporation process and a high vacuum chemical vapor deposition process; and forming the light shielding layer comprising the first layer and the second layer by a patterning process.

\* \* \* \* \*

UNITED STATES PATENT AND TRADEMARK OFFICE
CERTIFICATE OF CORRECTION

PATENT NO. : 10,910,497 B2
APPLICATION NO. : 16/330292
DATED : February 2, 2021
INVENTOR(S) : Xuefei Sun Page 1 of 1

It is certified that error appears in the above-identified patent and that said Letters Patent is hereby corrected as shown below:

On the Title Page

In item (57), in Abstract, Line 1, delete "the invention discloses" and insert therefor -- the disclosure discloses --.
In item (57), in Abstract, Line 4, delete "includes: a" and insert therefor -- includes a --.
In item (57), in Abstract, Line 9, delete "present invention" and insert therefor -- present disclosure --.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*